(12) United States Patent
Cok et al.

(10) Patent No.: US 6,570,584 B1
(45) Date of Patent: May 27, 2003

(54) BROAD COLOR GAMUT DISPLAY

(75) Inventors: Ronald S. Cok, Rochester, NY (US); Rodney D. Feldman, Rochester, NY (US); John C. Burtis, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/571,615

(22) Filed: May 15, 2000

(51) Int. Cl.$^7$ ................................................ G09G 5/02
(52) U.S. Cl. ....................................................... 345/690
(58) Field of Search ................................ 345/604, 613, 345/690, 694, 695, 696, FOR 168, FOR 171

(56) References Cited

U.S. PATENT DOCUMENTS

| | | | |
|---|---|---|---|
| 4,800,375 A | * 1/1989 | Silverstein et al. | 340/703 |
| 4,994,901 A | 2/1991 | Parulski et al. | |
| 5,087,610 A | * 2/1992 | Hed | 505/1 |
| 5,184,114 A | 2/1993 | Brown | |
| 5,233,183 A | * 8/1993 | Field | 250/214 |
| 5,243,414 A | 9/1993 | Dalrymple et al. | |
| 5,563,621 A | * 10/1996 | Silsby | 345/43 |
| 5,614,925 A | 3/1997 | Braudaway et al. | |
| 5,724,062 A | * 3/1998 | Hunter | 345/102 |
| 5,736,754 A | * 4/1998 | Shi et al. | 257/89 |
| 5,740,334 A | * 4/1998 | Lin et al. | 395/109 |
| 5,841,494 A | * 11/1998 | Hall | 349/98 |
| 5,844,699 A | 12/1998 | Usami et al. | |
| 6,380,961 B1 | * 4/2002 | Van Der Loop et al. | 347/131 |
| 6,456,301 B1 | * 9/2002 | Huang | 345/691 |

FOREIGN PATENT DOCUMENTS

| | | |
|---|---|---|
| EP | 0 513 173 B1 | 3/1997 |
| EP | 0 586 139 B1 | 5/1998 |

\* cited by examiner

Primary Examiner—Matthew C. Bella
Assistant Examiner—T. F. Cunningham
(74) Attorney, Agent, or Firm—Thomas H. Close

(57) ABSTRACT

A digital color image display device, includes a plurality of pixels, each pixel having a plurality of subpixels with at least one of the subpixels producing a color other than red, green or blue.

21 Claims, 3 Drawing Sheets

BROAD COLOR GAMUT DISPLAY

FIELD OF THE INVENTION

The present invention relates to solid-state display devices and means to create a broader display gamut than is conventionally achieved or to optimize the gamut for a particular application.

BACKGROUND OF THE INVENTION

Digital image display devices are well known and are based upon a variety of technologies such as cathode ray tubes and solid state light emitters such as LEDs. In most cases, each display element or pixel, is composed of red, green, and blue colored subpixels. By combining the illumination of each of these three subpixels in an additive color system, a wide variety of colors can be achieved. These are often represented as a triangular space on a CIE chromaticity diagram whose three defining points represent visual tristimulus values. In FIG. 2, a generic CIE chromaticity diagram 10 shown with a triangular area 12 representing the colors defined within the NTSC specification defined by three color points 14 at the corners of the triangle 12. This triangular area is called the color gamut of the display device. Other coordinate triplets can represent other color gamut specifications, for example the colors to which retinal pigments are responsive. In the printing industry, the use of multiple layers using combinations of inks in the subtractive primary colors (cyan, magenta and yellow) as well as black (K), is well known as are conversions from the typical 3-color additive systems (R,G,B) used for displays to the four-color subtractive printing processes, for example, cyan, yellow, magenta, and black (CYMK); (see European Patent EP 0 586 139 B 1, by Litvak et al., May 27, 1998, entitled *Printing Apparatus and Method for More than Five Colours*). It is also known to employ even more colored inks, such as international orange and fluorescent inks in the printing process.

Despite the versatility of known digital image display devices, these devices cannot display every color that can be seen by a human, that is, the color gamut of these devices is limited. For example, conventional cathode ray tube (CRT) displays are limited to the colors expressed by combinations of the phosphors coated on their vacuum tube. That is, they cannot reproduce colors outside the gamut defined by their chromaticity coordinates. Other types of displays (e.g. liquid crystal devices LCDs) have similar limitations on their light sources and/or filter elements. Typically, the colors achieved by conventional digital image display devices produce colors having limited saturation. Generally, the available colors are matched as best they can by applying knowledge of the input scene or capture device and the display device (see U.S. Pat. No. 5,243,414, issued Sep. 7, 1993 to Dalrymple et al., entitled *Color Processing System*, and U.S. Pat. No. 5,844,699, issued Dec. 1, 1998 to Usami et al., entitled *Color Image Processing Apparatus*). Often, this is achieved through the use of standard color spaces with lookup tables that convert images from one color space to another as needed (see for example U.S. Pat. No. 5,614,925 issued Mar. 25, 1997 to Braudaway et al., entitled *Method and Apparatus for Creating and Displaying Faithful Color Images on a Computer Display*, and the International Color Consortium specifications at http://www.color.org).

Today, most images are displayed on a CRT or a liquid crystal display and are described as combinations of red, green, and blue with a numerical value (usually from 0 to 255 equivalent to 8 bits) for each pixel color. (For example, see EP 0 513 173 B1, by Shapiro et al., Mar. 3, 1997, entitled *Liquid Crystal Display Panel System and Method of Using Same*). There are thus 256×256×256 or about 16 million possible color combinations. Although this appears to be a lot of color combinations, the combinations cannot express some colors, even if additional bits are added because the additional bits provide only a finer control of the amount of each of the three colors used in the display, not the gamut of colors that can be produced by the display. Therefore the color gamut is limited and a desired color often cannot be properly displayed by a device due to the inherent limitations in the color of the subpixels (e.g. phosphors). The colors of the subpixels can vary and various implementations use different combinations thus modifying the color gamut of the device (see U.S. Pat. No. 5,184,114, issued Feb. 2, 1993 to B. Brown, entitled *Solid State Color Display System and Light Emitting Diode Pixels Therefor*).

Mechanisms for ameliorating the gamut limitations of a CRT by equalizing the display drive signals, for example, are known (see U.S. Pat. No. 4,994,901, issued Feb. 19, 1991 to Parulski et al, entitled *Method and Apparatus for Increasing the Gamut of an Additive Display Driven from a Digital Source*). Alternatively, ways to optimize the use of the available colors are known (see U.S. Pat. No. 5,614,925). However, these techniques do not address the fundamental issue of limited color gamut in the display device. There is a need therefore for an improved digital image display device having an extended color gamut.

SUMMARY OF THE INVENTION

The need is met by providing a digital color image display device, that includes a plurality of pixels, each pixel having a plurality of subpixels with at least one of the subpixels producing a color other than red, green or blue.

According to the invention, each pixel can be composed of more than red, green, and blue emitters or colors other than red, green, and blue. The emitters are controlled using conventional means. Where a digital color signal is not matched to the available pixel colors, a digital color transformation device calculates a suitable combination of available colors to match the desired color representation.

Advantages

The advantages of this invention are a digital image display device with a wider and different range of colors providing a wider color gamut to the user. The wider gamut provides superior image rendition and superior calibration capabilities. Alternatively, an optimized sub-gamut can be used to increase efficiency and lifetime of the device by making one or more of the colors within the gamut defined by the other colors. The device can accept a variety of color specifications. By transforming conventional color specification signals, the device can accept images from existing systems while providing superior color rendition and fidelity.

DETAILED DESCRIPTION OF THE INVENTION

Solid state organic light emitting display devices (OLEDs) can be nearly infinitely varied in their emissive frequency, at least within the visible electromagnetic spectrum. These display devices have a very high resolution and can combine multiple colors to create multi-color pixels by placing different colors in close proximity or by stacking them on top of each other (for example European Patent EP 0 808 244 A2). These OLED devices can be used to create high-resolution displays with a wider variety of color options and overcome the limitations of conventional display devices such as cathode ray tubes or liquid crystal displays. These OLED devices can be used to create a display device with more than the conventional red, green, and blue sub-pixels which will have a wider color gamut and superior color rendition. Alternatively, sub-pixels other than the traditional RGB can be optimized for a particular application. The display system can use a conventional RGB signal to create an appropriate multi-color signal or be adapted to other signal input modalities.

Figure 1:
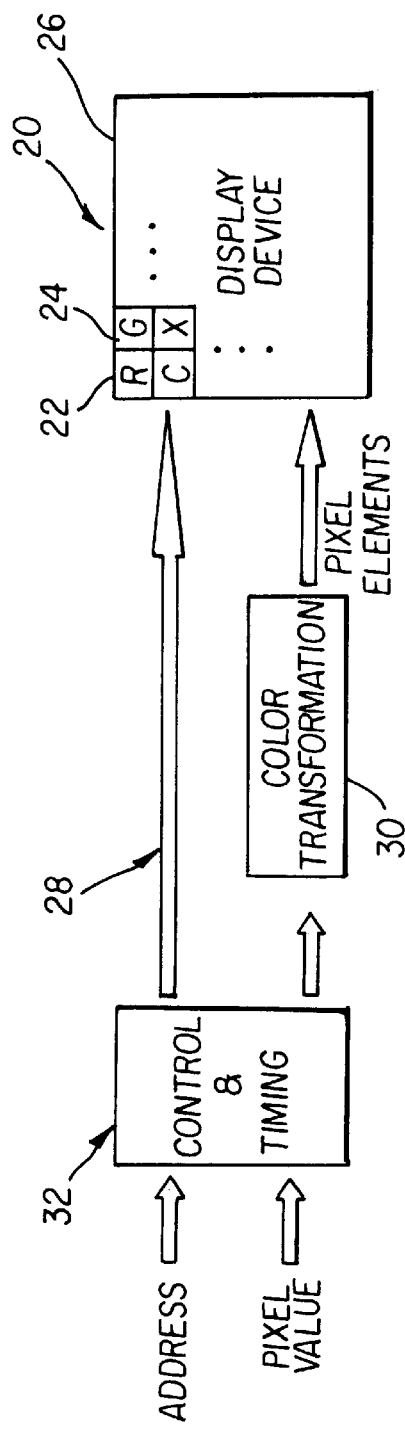
FIG. 1 is a block diagram showing a system including a display device.
Figure 2:
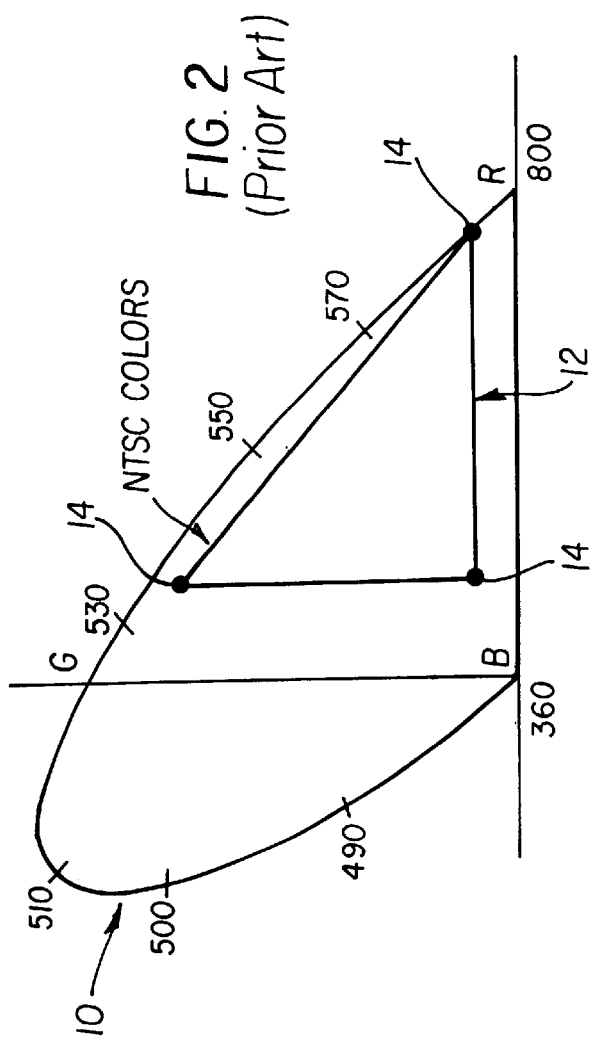
FIG. 2 is an RGB CIE chromaticity diagram with chromaticity coordinates representing the prior art NTSC television standard colors.
Figure 3:
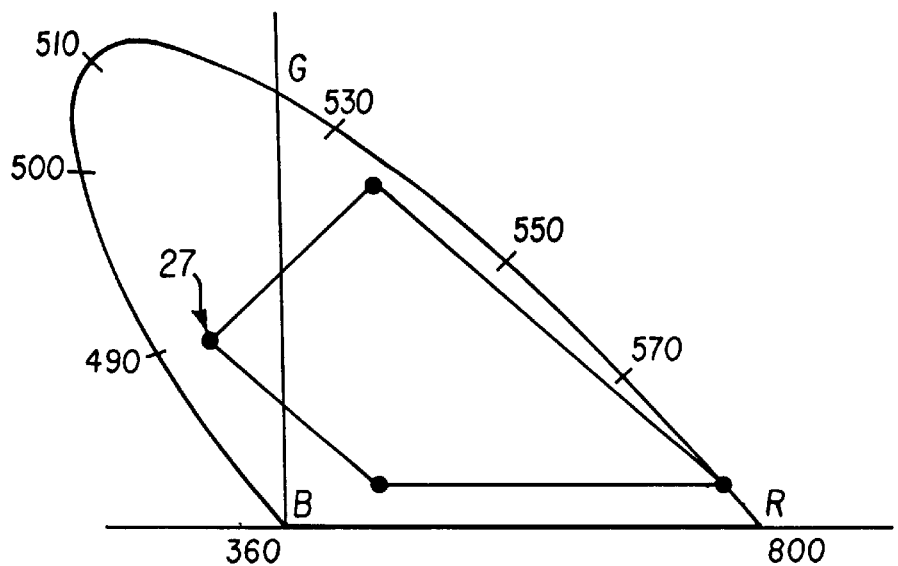
FIG. 3 is an RGB CIE chromaticity diagram with increased gamut.

Referring to FIG. 1, the display device 20 includes an integrated circuit with pixels 22 color-emitting sub-pixels 24 arranged on a substrate 26. Each pixel 22 is includes one or more light emitting sub-pixels 24 (indicated by an X) other than, or in addition to, red, green, and blue light emitting sub-pixels (indicated by R,G,B). One effect of the one or more light emitting sub-pixels indicated by X can be to increase the available gamut by including more colors than are otherwise available, where the additional sub-pixel is outside the gamut of the other sub-pixels. This is shown in the chromaticity diagram in FIG. 3 where the area inside the polygon (that is, the number of colors that can be expressed by the system) is increased due to the addition of another color point 27 not within the existing gamut.

Figure 4:
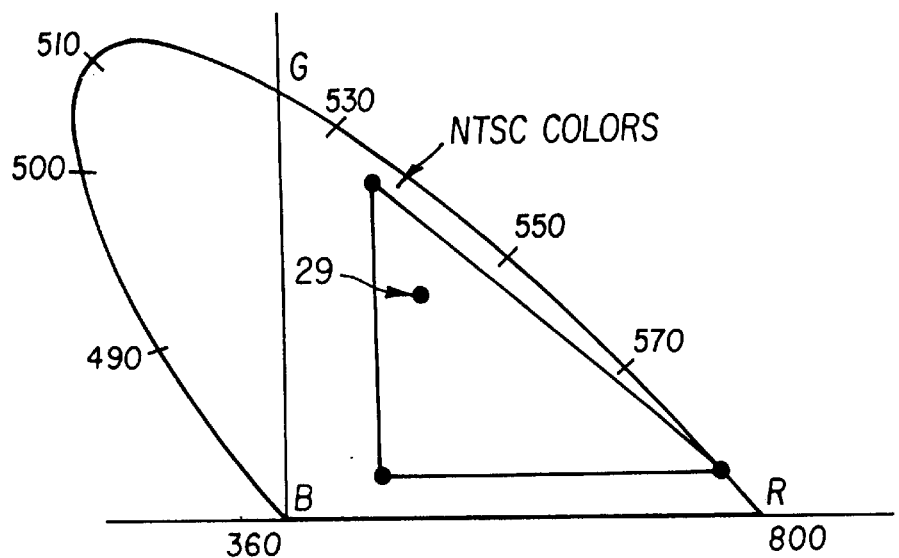
FIG. 4 is an RGB CIE chromaticity diagram with an additional in-gamut emitter.

Referring to FIG. 4, another effect can be created by choosing an additional sub-pixel element(s) that has a color 29 that is within an existing red-green-blue gamut to increase the efficiency and lifetime of the display device, since the display device does not need to be driven as hard for colors near the color of the additional sub-pixel element. Note that the sub-pixels generally vary in their efficiency and the addition of an extra element, either within or without the existing gamut may increase the brightness, and/or lifetime and efficiency of the display. Also, a given color can be reproduced by more than one combination of sub-pixels by varying the relative power of the various sub-pixels.

The pixels 22 are arranged in a regular pattern on the substrate and are activated and controlled using traditional address and data control lines 28, capacitive storage, controlling transistors, and the like. The controlling transistors can be located on the substrate (active matrix) or external to the substrate (passive matrix). The sub-pixels 24 are provided with independent control lines, as is known in the art.

Data signals are produced by a color data transformation circuit 30 that converts an input color specification signal to the values necessary for controlling each of the sub-pixels 24. The circuit is preferably constructed using conventional digital signal processing circuits. The transformation circuit 30 calculates the appropriate amounts of light from each of the available sub-pixel colors to reproduce the desired color at each pixel using well known color transformations.

The output of the transformation circuit 30 is pixel values matched to the display device. The transformations are typically matrix transforms or lookup tables; (U.S. Pat. Nos. 5,243,414 and 5,844,699 describe various apparatus for accomplishing such transformations). Each pixel is defined as a combination of color elements. Each element requires a numerical value; this value can be eight bits or any other value depending on the needs of the overall system. For example, if a six-color, eight-bit system is used, the output of the color transformer will be six, eight-bit values, regardless of the input specification. However, it is not necessary that all color elements have the same bit-depth. For example, a green sub-pixel might have 8 bits while the red and blue sub-pixels might have four bits each. Thus some elements might have reduced dynamic range. These values are then transmitted to the display device. The display device 20 is controlled by a conventional display controller device 32 which creates the appropriate address values, timing signals, etc. applied to the address and data control lines 28.

Figures 5, 6, 7:
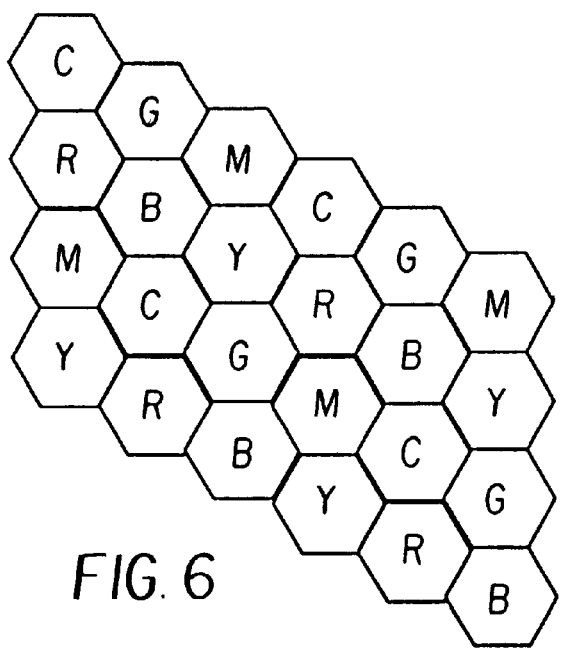
FIG. 5 is a six-color display with square pixels (red, green, blue, cyan, magenta, yellow)
FIG. 6 is a is a six-color display with hexagonal pixels (red, green, blue, cyan, magenta, yellow)
FIG. 7 is a four-color display with square pixels (red, green, blue, infra red).

Referring to FIG. 5, according to one embodiment, each pixel 22 includes six color sub-pixels, one each of red, green, blue, yellow, cyan, and magenta. The actual frequency at which each sub-pixel element 24 will emit photons can be determined to suit the application. For example, if a particular frequency or combination of frequencies, is of special interest, the sub-pixels can be chosen to match those frequencies, thus optimizing the quality of the display for that application. Since virtually any combination can be made, if enough sub-pixels are used, the display can be optimized for color gamut, specific frequencies, or resolution.

It is also important to express the desired colors in an appropriate color space and as a combination of appropriate wavelengths. The present display device 20 includes sub-pixels that produce colors other than the conventional red, green, and blue colors. A color specification could be written as a combination of the colors available in a specific display device (e.g. red, green, blue, and yellow). However, this approach would require a different specification for each group of display devices incorporating a specific combination of color elements.

A more generic approach is to use a formal color specification such as CIE (see references) and then transform the image color specification into the appropriate color values available from the display device. Alternatively, an existing, though more limited, standard such as the conventional RGB standard (for example, the USA Federal Communications Commission National Television Systems Committee or N.T.S.C.), can be used with an appropriate color space conversion. This latter approach will yield compatibility with many existing image specifications and will still provide superior color rendition although with a more limited range and conventional gamut.

FIG. 5 illustrates a pattern 40 of sub-pixels 42 for a display device with an arrangement of R,G,B,C,M,Y colored sub-pixels arranged in repeating rectangular patterns that attempts to optimize the color reproduction of an image by reducing the amount of color aliasing. Other arrangements are possible. FIG. 6 shows a hexagonal arrangement of color sub-pixels. (Polygons enclosing the letter "R" represent red pixels, "B" blue pixels, "G" green pixels, "C" cyan pixels, "Y" yellow pixels, and "M" magenta pixels.)

Although four and six colors have been described, it is likely that when increased color gamut is desired, a system will first incorporate an additional, fourth sub-pixel element, then a fifth, and so on, selecting that portion of the color space most useful to the application and readily realized in practice.

Referring to FIG. 7, the frequencies and arrangements of colored sub-pixels can be extended to non-visible sub-pixels. For example, a fourth sub-pixel element (designated by "i") radiating in the infrared could be added. The invisible light can be used to augment the information displayed by the device and detected by another device. The radiation (from any sub-pixel, but preferentially invisible ones) can be modulated to encode additional information.

The organization of sub-pixels to create a single pixel color can be integrated in a third dimension by stacking the sub-pixels on top of each other. This technique reduces the surface area required on the substrate and creates single multi-colored pixels as viewed from above. However, the control mechanisms used to create the appropriate mix of sub-pixels are identical, only their spatial arrangement has been modified.

In a preferred embodiment, the invention is employed in an emissive display that includes Organic Light Emitting Diodes (OLEDs) which are composed of small molecule polymeric OLEDs as disclosed in but not limited to U.S. Pat. No. 4,769,292, issued Sept. 6, 1988 to Tang et al., entitled *Electroluminescent Device with Modified Thin Film Luminescent Zone* and U.S. Pat. No. 5,061,569, issued Oct. 29, 1991 to VanSlyke et al., entitled *Electroluminescent Device with Organic Electroluminescent Medium*. Many combinations and variations of OLED materials can be used to fabricate such a device.

The invention has been described in detail with particular reference to certain preferred embodiments thereof, but it will be understood that variations and modifications can be effected within the spirit and scope of the invention.

PARTS LIST 10 chromaticity diagram
12 triangular area
14 color point
20 display device
22 pixel
24 sub-pixel
26 substrate
27 out of gamut color point
28 control lines
29 in gamut color point
30 color transformation circuit
32 display controller device
40 pixel pattern
42 sub-pixel

What is claimed is:

1. A digital color image display device, comprising:
   a plurality of pixels, each pixel having four or more subpixels, three of the subpixels being red, green and blue, respectively, and at least one of the subpixels producing an output display color that is outside a gamut defined by the red, green and blue subpixels.

2. The digital color image display device claimed in claim 1, wherein each pixel has 6 subpixels arranged in a rectangular array.

3. The digital color image display device claimed in claim 2 wherein the subpixels in adjacent pixels alternate colors in the order, including rotations or reflections thereof:

| R | C | G | M | B | Y |
|---|---|---|---|---|---|
| G | M | B | Y | R | C |
| B | Y | R | C | G | M. |

4. The digital color image display device claimed in claim 2 wherein the subpixels are arranged in a hexagonal layout.

5. The digital color image display device claimed in claim 2, wherein the subpixels are vertically stacked organic light emitting pixels.

6. The digital color image display device claimed in claim 1, wherein each pixel has 4 subpixels arranged in a rectangular array.

7. The digital color image display device claimed in claim 6 wherein the subpixels in each pixel produce red, green, blue and yellow respectively and are arranged in the order, including rotations or reflections thereof:

| R | G |
|---|---|
| B | Y. |

8. The digital color image display device claimed in claim 6, wherein the subpixels are vertically stacked organic light emitting pixels.

9. The digital color image display device claimed in claim 1, wherein the subpixels are stacked organic light emitting pixels in order of frequency with lowest frequency on top.

10. The digital color image display device claimed in claim 1, wherein the subpixels produce red, green, blue, and yellow.

11. The digital color image display device claimed in claim 1, wherein the subpixels produce red, green, blue, cyan, magenta and yellow.

12. The digital color image display device claimed in claim 1, wherein at least one subpixel produces light outside the visible spectrum.

13. The digital color image display device claimed in claim 2, wherein the at least one subpixel produces infrared light.

14. The digital color image display device claimed in claim 12, wherein the at least one subpixel produces ultraviolet light.

15. The digital color image display device claimed in claim 12, wherein the subpixels produce red, green, blue, and infrared light.

16. The digital color image display device claimed in claim 13, wherein the subpixels produce red, green, blue, and ultraviolet light.

17. The digital color image display device claimed in claim 15 wherein the subpixels are arranged in the order, including rotations or reflections thereof:

| R | G |
|---|---|
| B | i. |

18. The digital color image display device claimed in claim 16 wherein the subpixels are arranged in the order, including rotations or reflections thereof:

| | |
|---|---|
| R | G |
| B | u. |

19. The digital color image display device claimed in claim 1, further comprising control logic for performing a color transformation from a standard color space to display dependent color space code values.

20. The digital color image display device claimed in claim 19, wherein the control logic produces code values having different bit-depths for at least two of the sub-pixels.

21. The digital color image display device claimed in claim 1, wherein the pixels are organic light emitting diodes.

\* \* \* \* \*